Feb. 6, 1962 J. A. PIETSCH 3,019,609

THERMOELECTRIC AIR CONDITIONING ARRANGEMENT

Filed Dec. 21, 1960

INVENTOR.
JOSEPH A. PIETSCH

BY [signature]

HIS ATTORNEY

United States Patent Office 3,019,609

Patented Feb. 6, 1962

3,019,609

THERMOELECTRIC AIR CONDITIONING ARRANGEMENT

Joseph A. Pietsch, Louisville, Ky., assignor to General Electric Company, a corporation of New York Filed Dec. 21, 1960, Ser. No. 77,319
4 Claims. (Cl. 62—3)

The present invention relates to a thermoelectric air conditioning apparatus and is more particularly concerned with an improved arrangement for supplying the thermoelectric heating and cooling unit of the apparatus with a source of direct current power.

When two materials which have dissimilar thermoelectric properties are joined and a direct current is passed through the junction, the junction becomes either heated or cooled depending upon the direction of the current flowing therethrough. This phenomenon is known as the Peltier effect and exists in all junctions of dissimilar materials to some extent. Some materials or alloys, due to a combination of thermal and electrical properties, produce an effect that is many times the magnitude of others and these materials or alloys are called thermoelectric material. For example, thermal junctions formed between certain alloys of lead, bismuth, or antimony with tellurium or selenium have produced heating and cooling properties of a magnitude that can be useful in air conditioning application.

A thermoelectric air conditioning device, in its simplest form, comprises a source of D.C. power which forces a current through a series of junctions of dissimilar thermoelectric materials. Alternate junctions of these thermocouples either absorb heat or generate heat and are, therefore, segregated so that all like junctions are exposed to the same ambient. The cold junctions then produce a cooling effect in one ambient while the hot junctions provide heat to another ambient. The above-described arrangement of thermoelectric junctions is commonly called a thermopile and, for air conditioning purposes, one side of the thermopile may be arranged in heat exchange relationship with air from an enclosure while the other side is arranged in heat exchange relationship with an external source of cooling or heating, such as outdoor air. When such an arrangement is used for air conditioning a house or building or for refrigeration purposes, it is necessary to convert the A.C. power, usually supplied to the house, into D.C. power so that it can be applied to the thermoelectric device. In other words, inasmuch as the thermoelectric junctions of a thermoelectric device only supply heat or absorb heat when a unidirectional current is passed therethrough, it is necessary to connect a source of D.C. power across the thermoelectric junctions of the device and this makes it desirable to convert the regular A.C. power source supplied to the housing structure into D.C. power.

It is an object of the present invention to provide a thermoelectric air conditioning device of the above-described type having an improved arrangement for supplying a source of electrical current to the thermoelectric unit of the air conditioning device.

Further objects and advantages of the invention will become apparent as the following description proceeds and the features of novelty which characterize the invention will be pointed out with particularity in the claims annexed to and forming a part of this specification.

In carrying out the objects of the present invention, there is provided a thermoelectric heating and cooling device which utilizes the Peltier effect for producing the desired heating or cooling. The device comprises a thermoelectric structure having a pair of spaced apart thermal conductive sheet members with a thermopile arranged therebetween. The thermal junctions of the thermopile are so disposed as to heat or cool one of the sheet members while respectively cooling or heating the other sheet member. Fin means extend from the sheet members into heat exchange relationship with the air on opposite sides of the respective sheet members. A synchronous motor is provided for rotating the thermoelectric structure in synchronization with the frequency of an A.C. power supply thereby to rotate the sheet members and fins in heat exchange relationship with air adjacent the outwardly disposed sides of the sheet members. In order to provide a source of electrical power to the thermopile, there is mounted for rotation with the thermopile a commutator having its opposite poles connected to opposite sides of the thermopile structure. Brushes, electrically connected to opposite terminals of the A.C. power source, contact the opposite poles of the commutator and produce an alternating voltage at the commutator. The rotation of the commutator in synchronization with the A.C. power supply frequency mechanicaly converts the A.C. voltage into a pulsating D.C. voltage which is applied to the opposite sides of the thermopile. This produces a unidirectional flow of current through the thermopile.

For a better understanding of the invention, reference may be had to the accompanying drawings in which.

Figures 1, 2, 3:
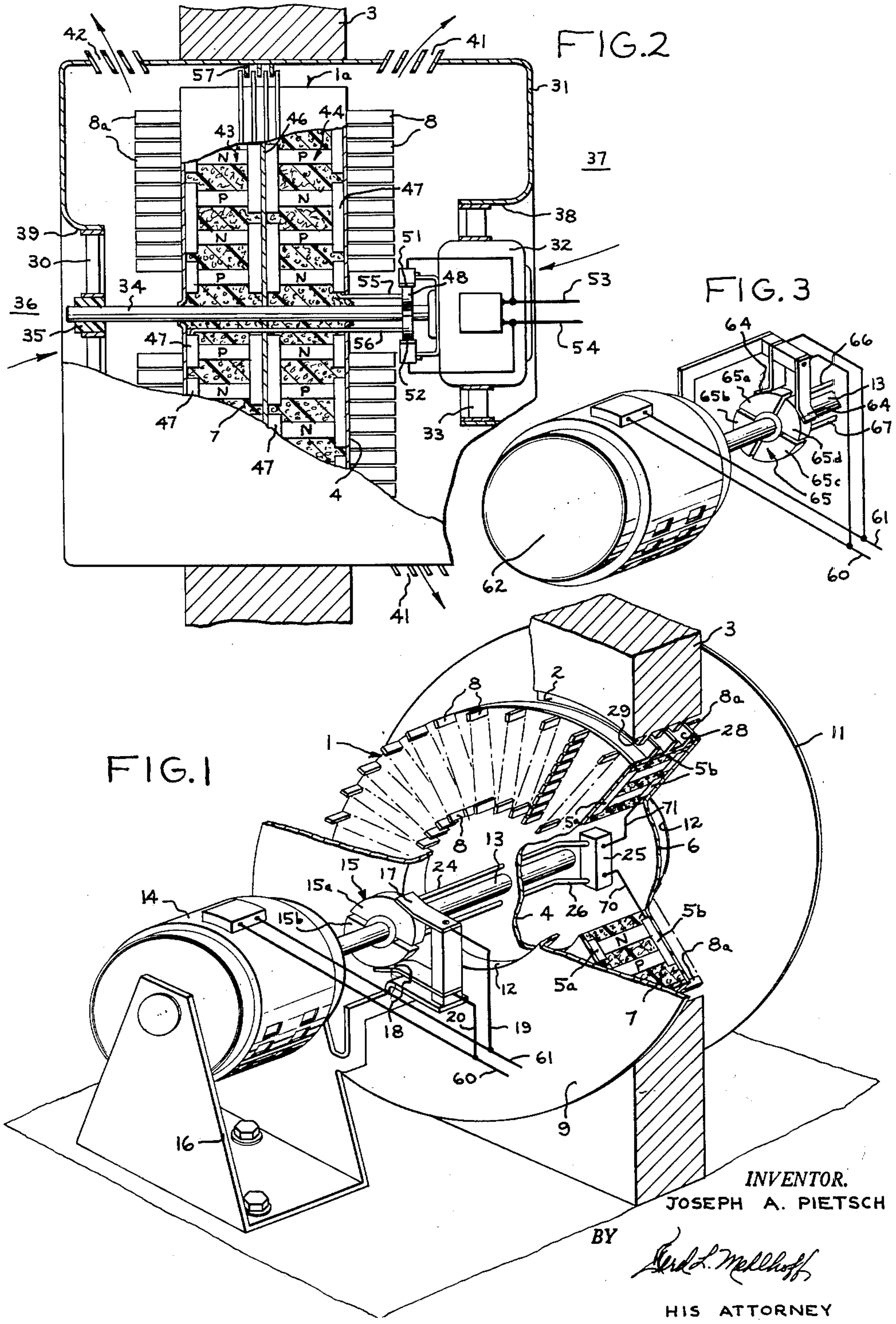
FIG. 1 is a perspective view illustrating in somewhat diagrammatic form the various components necessary for the heat pump device of the present invention.
FIG. 2 is a cross sectional view of a heat pump arrangement employing the principles of the present invention and adapted for mounting in an outer wall of an enclosure for conditioning the air of the enclosure.
FIG. 3 is a perspective view illustrating the use of a four bar commutator for converting the alternating current to direct current.

Referring now to FIG. 1, there is illustrated in very simple form the air conditioning concepts of the present invention. The air conditioner of FIG. 1 comprises an annular thermoelectric heating and cooling unit or structure 1 mounted within an aperture 2 formed through the wall or partition 3 of an enclosure. It should be mentioned that the partition 3 need not be the outer wall of the enclosure. It is only necessary that the partition be a barrier or panel of some type which has its opposite sides exposed respectively to indoor air and outdoor air. Thus it could comprise the inner barrier or panel of an air conditioning case into which indoor air and outdoor air is circulated through suitable ductwork. The thermoelectric unit includes a pair of spaced apart heat conductive plates or sheet members 4 and 6 having a thermoelectric heating and cooling means or thermopile mounted therebetween. In the present application and claims annexed thereto, a thermoelectric heating and cooling means or thermopile is meant to apply to those devices which utilize the Peltier effect to provide a source of cooling in one area and a source of heat in another area of the device. The thermoelectric heating or cooling means may comprise any of the well known thermopile arrangements and is securely and rigidly mounted between the sheet members 4 and 6.

In FIG. 1, the thermopile disposed between the spaced apart sheet members 4 and 6 comprises an array of thermoelectric junctions of series connected materials having dissimilar thermoelectric properties. The thermoelectric materials are indicated by blocks designated by either N or P. The N and P nomenclature is prevalent in semi-conductor terminology at present and is used herein for convenience in differentiating materials having dissimilar thermoelectric properties. An N material includes an abundance of electrons. A P material includes an abundance of electron vacancies or holes. A thermocouple is formed of an N type material joined to a P type material through a suitable block *5a* or *5b* of thermally and electrically conductive material, such as copper. When a direct current is passed through such a thermocouple in the positive direction, i.e. from N to P, the junction between the N and P materials becomes cold. Conversely when a direct current is passed through the junction in the opposite direction, i.e. from P to N, the junction then becomes hot.

As may be seen in FIG. 1 the conductive blocks *5a* and *5b*, forming alternate junctions between the thermoelectric materials, are disposed respectively adjacent the opposite sheet members 4 and 6. That is, all of the conductive blocks *5a* are adjacent sheet member 4 and all of the conductive blocks *5b* are adjacent sheet member 6. Thus all of the junctions adjacent one sheet member will heat that sheet member while the other sheet member is cooled by the junctions adjacent the respective sheet member. The blocks *5a* and *5b* should be electrically insulated from the sheet members 4 and 6 by some material providing good electrical insulation but not providing a substantial barrier to the transfer of heat to the sheet members. Any of the well-known types of insulating materials having these characteristics, such as a sheet of mica or plastic-type insulation coating, can be used for this purpose. All of the remaining space between the thermocouple members and connector members is filled with one of the well known plastic type foam fillers 7 which adds strength to the thermopile structure and which provides heat insulation between the opposite or alternately disposed electrical junctions.

Projecting outwardly from the outwardly disposed sides of the sheet members 4 and 6 are a plurality of fin means or fins 8 and *8a* which are arranged in heat transfer relationship with the ambient air on opposite sides of the thermoelectric heating and cooling unit 1. In the arrangement shown in FIG. 1, the fin means 8 and *8a* comprise a plurality of slender outwardly extending fin sections arranged in straight lines and thereby take the form of vanes or blades of the blower type which are utilized for circulating separate air streams over the opposite faces of the unit in a manner to be hereinafter explained. Outwardly from the sheet members 4 and 6 on opposite sides of the unit are disposed casing members or scroll members 9 and 11. In the embodiment shown in FIG. 1, the scroll members 9 and 11 are attached directly to the wall 3 and encompass an air space around the fins on opposite sides of the unit. The scroll members 9 and 11 also provide a convenient cover for the heating and cooling unit disposed within the wall. In FIG. 1, the scroll members 9 and 11 are open around their outer periphery and are each provided with a central opening 12 through which air is circulated from within the enclosure and from the opposite outer side of the thermoelectric unit into the space between the scroll members 9 and 11 and the sheet members 4 and 6. As may be seen in FIG. 1, the thermoelectric unit, including the sheet members 4 and 6 and their respective fins, is mounted for rotation so that the fins can be moved in heat exchange relationship with the air in the space between the opposite sides of the unit and the scroll members 9 and 11. Upon rotation of the thermoelectric heating and cooling unit, fins 8 and *8a* act as the blades of a centrifugal blower and force air outwardly around the periphery of the scroll members. Air is drawn into the unit through the openings 12 in the scroll members. Means are provided for rotating the thermoelectric unit 1 including a rotatable shaft 13 which extends horizontally through the unit and supported on one end by a drive motor 14 and on the other end by a bearing member (not shown) suitably supported from the wall 3 or partition. In FIG. 1, the drive motor 14 is connected directly to the shaft 13 and motor is supported by suitable mounting bracket 16 extending upwardly from the floor. However, it is contemplated that the motor could very easily be supported by brackets extending outwardly from the wall or from the scroll member 9 attached to the wall.

The motor 14 is a synchronous motor and operates in synchronization with the frequency of the A.C. power source. More specifically, in the illustrated invention of FIG. 1, the motor is a two pole synchronous motor and operates off of the 60 cycle per second A.C. power source at 3600 r.p.m.'s. It is within the scope of the present invention, however, to provide a synchronous motor having a greater number of poles such as 4 poles, 6 poles or any even number of poles. A synchronous motor having more poles operates at a lower speed which is, however, always directly proportional to the frequency of the A.C. power supply. Thus, while the two pole synchronous motor operating on a 60 cycle frequency, has a synchronous speed of 3600 r.p.m., a 4 pole synchronous motor operating on the same frequency has a synchronous speed of 1800 r.p.m.'s. The motor therefore drives the shaft 13 and the thermopile in synchronization with the frequency of the A.C. power source designated by the power lines 60 and 61 in FIG. 1.

A suitable source of D.C. voltage must be applied across the thermoelectric unit in order to produce cooling or heating in the thermal junctions of the thermopile. The present invention accomplishes this purpose through use of the synchronous motor 14 and a commutator 15, which mechanically converts the alternating current of the regular household A.C. power source into a pulsating direct current. As may be seen in FIG. 1, the commutator 15 is mounted on the shaft 13 and rotates therewith. A.C. power is conducted to the opposite poles *15a* and *15b* of the commutator 15, through a pair of brushes 17 and 18 which are, in turn, connected to the household A.C. power supply through lines 19 and 20. Attached respectively to the opposite poles or segments *15a* and *15b* of the commutator 15 are lead rods 24 and 26 which extend along the shaft. These lead rods which form a part of the electrical circuit conducting current to the thermoelectric unit may, in turn, be connected to an electrical filter means or device which contains capacitive reactive elements, and possibly inductive reactive elements, such as are provided in any of the filter circuit arrangements commonly used in the art. While this electrical filter 25 is not necessary for operation of the thermopile, the removal of some of the undesirable ripple from the fluctuating input does improve the performance of the thermopile structure. The leads 70 and 71 connect the filter 25 to the thermopile. Obviously more than one set of leads 70 and 71 could be used to conduct current from the electrical filter device to the opposite sides of the thermopile, and it is envisioned that several parallel electrical circuits can be provided to connect separate arrays of series connected thermoelectric materials within the thermopile.

Inasmuch as the commutator 15 is mounted on the shaft 13 and is, therefore, rotated in synchronization with the frequency of the power source, it makes one revolution for each cycle of the alternating current supply. The commutator 15 is arranged with respect to the brushes 17 and 18 so that one of the commutator bars, such as segment *15a*, is phased so that it is always in contact with a brush that is positive in potential with respect to the other brush, while, conversely, the opposite segment *16b* of the commutator is always in contact with a brush that is negative in potential with respect to the other brush. In this manner the alternating current is converted to a pulsating direct current which flows from the pole *15a* through the connector rod 24 and, if desirable, through the filter to one side of the rotating thermopile and returns through the filter and the rod 26 to the other pole *15b*. It is possible to change the direction of flow through the commutator and thereby through the thermopile merely by reversing the connectors 19 and 20 leading to the household power supply.

Referring now to FIG. 3 there is shown a schematic arrangement in which a 4 pole synchronous motor 62 is utilized to rotate a thermopile structure (not shown) which is attached to the shaft 13. The 4 pole synchronous motor when operated on a 60 cycle A.C. power supply rotates at 1800 r.p.m.'s and the shaft 13, therefore, rotates once for every two cycles of alternating current supply. By using a 4 bar commutator 65 attached to the shaft 13, and 2 brushes 64, arranged at 90° from each other and connected to opposite A.C. power supply lines 60 and 61, the alternating current from the power lines 60 and 61 is mechanically converted into a pulsating direct current in the same fashion as was heretofore explained in connection with the commutator 15 of FIG. 1. Connector rod 66 electrically connected to the opposite segments or bars **65*a* and 65*c* of the commutator 65, conduct current to one side of the thermopile structure (not shown in FIG. 3) and conductor rod 67 connecting respectively with opposite segments or bars 65*b* and 65*d* of the commutator, conducts current from the opposite side of the thermopile structure. This same general type of construction could be utilized so that a synchronous motor having many more poles such as 6 poles or 8 poles could be utilized respectively with a commutator on the shaft 13** having an equal number of segments as that of the synchronous motor. This makes it possible to utilize synchronous motors which operate at much lower speeds.

For explaining the operation of the device we will assume that the scroll member 9 is facing the outdoors and that the scroll member 11 is facing the indoors. During cooling operation current is passed through the thermopile in a direction so that the junctions of the thermopile adjacent the sheet member 4 are hot while the junctions of the thermopile adjacent the sheet member 6 are cold. Sheet member 4 and the fins 8 attached thereto are heated by the thermopile and sheet member 6 and its fins **8*a* are cooled. During rotation of the thermoelectric unit, outdoor air is circulated through the opening 12 of the scroll member 9 where it absorbs heat from the fin members 8 attached to the sheet member 4. The outdoor air is then propelled by the centrifugal action of the rotating fins 8 and dissipates the heat absorbed from these fins to the outdoors upon being discharged from behind the scroll 9. Air flows from within the enclosure through the aperture 12 in the scroll member 11 whereupon it passes in heat exchange relationship with the sheet member 6 and fins 8*a* extending therefrom. The fin members 8*a* extending from the sheet member 6 absorb heat from this air thereby cooling it prior to discharging it back into the enclosure from around the periphery of the scroll 11. The heat absorbed by the fin members 8*a* extending from the side 6 is then transferred (pumped) via the thermopile to the opposite side of the unit whereupon it is discharged into the outdoor air through the members 8 extending outwardly from the side of the sheet member 4**.

In order to prevent the short circuiting of air from one side of the thermoelectric unit to the other a suitable barrier is provided for sealing the periphery of the rotatable unit. In the embodiment shown in FIG. 1 the air sealing means takes the form of a labyrinth seal comprising a plurality of intermeshed sealing rings 28 and 29 attached respectively to the outer periphery of the unit and to the inner circumference of the wall 3. Obviously, other suitable air sealing arrangements can be utilized as long as they do not prevent rotation of the thermoelectric unit.

It is very probable that air conditioning arrangement of this type will be more desirable from an installation standpoint if all of the components are completely enclosed in a suitable case and so that the air conditioner comprises a single unit which can be mounted through a window or aperture in a wall somewhat in the same manner as room air conditioners are presently mounted. Or the case may be mounted in some convenient location with suitable air ductwork leading thereto for introducing indoor and outdoor air to the opposite sides of the rotatable thermoelectric heating and cooling unit mounted in the case. In FIG. 2 there is illustrated an arrangement of this type. The conditioner of FIG. 2 includes a thermoelectric heating and cooling unit **1*a* mounted for rotation within a suitable casing 31. Casing 31 may be either square or round whichever may be desirable from a mounting standpoint or from a manufacturing standpoint. On one side of the casing (preferably the outside) there is mounted the drive motor 32, which is a synchronous motor, and adapted to rotate a drive shaft 34 in synchronization with the frequency of the household electrical power source. As may be seen in FIG. 2, the motor 32 is supported by a spider mounting structure 33 extending from the side of the case 31. The motor, in FIG. 2, is mounted within the opening 38 in the side of the case and supports one end of the drive shaft 34. The opposite end of the shaft 34 is supported by a bearing 35 which retains the shaft in substantially a horizontal axis. Bearing 35 is supported within the opening 39 on the other side of the case by a spider member 30 attached to the side of the case 31. Openings 38 and 39 in the sides of the case provide entry passages for the introduction of indoor and outdoor air into the case on opposite sides of the thermoelectric unit. Outlet openings 41 and 42 are provided around the peripheral portions of the case in order to discharge outdoor air and indoor air from the unit. As may be seen in FIG. 2, the case 31 is adapted for mounting through an aperture in a wall 3 with one side thereof exposed to the enclosure 36 and the other side exposed to the outdoor ambient 37**.

In the embodiment of the invention illustrated in FIG. 2, the thermoelectric heating and cooling unit or thermopile structure **1*a* is of a slightly different arrangement than that shown in FIG. 1. This is done merely to illustrate another of the various arrangements of thermopile structures that could be used satisfactorily in the present invention. The air conditioner of FIG. 2 incorporates spaced apart sheet members 4 and 6 to which are attached outwardly extending fin members 8 and 8*a*. Between the spaced apart sheet members 4 and 6 is provided a thermopile which comprises two groups of series connected thermoelectric junctions, generally designated by the numerals 43 and 44. The two groups of series connected thermoelectric junctions 43 and 44 are separated by a thermally conductive sheet member 46 which may also be an electrical insulating member or may be provided with proper electrically insulated surfaces. Each of the groups 43 and 44 comprise a plurality of series-connected thermoelectric members having dissimilar thermoelectric properties and connected by suitable electrical conducting blocks 47. Blocks 47** of thermally and electrically-conductive material are used to form the junctions between the respective thermoelectric members. As in the description of the air conditioner of FIG. 1, the thermoelectric materials are indicated by blocks designated by either P or N, to differentiate the alternately connected thermoelectric members.

Current flow through the separate arrays or groups 43 and 44 is such that when the thermoelectric junctions of the group 43 adjacent one side of the heat conductive member 46 are hot, then the thermoelectric junctions of the group 44 adjacent the opposite side of the heat conductive members 46 are cold thereby causing a flow of heat from left to right as seen in FIG. 2. When the current flow is reversed in direction through the thermopile, then the heating and cooling junctions of the respective groups 43 and 44 are reversed and flow of heat is also reversed through the heat conductive member 46. In the arrangement of FIG. 2, it is conceivable that the array 44 of thermoelectric couples may have a greater number of thermoelectric elements of junctions than the array or group 43 of thermoelectric junctions. A thermopile of this type is said to be cascaded and may be used advantageously in some arrangements where it is required to operate with a relatively large temperature difference between sheet members 4 and 6.

As in the arrangement of FIG. 1, D.C. current is supplied to the thermopile through means of a two pole commutator 48 having its poles in electrical contact with a pair of brushes 51 and 52 which are, in turn connected to leads 53 and 54 leading to the A.C. power source. Extending from the poles of the commutator 48 are a pair of conductor bars or rods 55 and 56 which conduct current to and from the opposite sides of the thermopile structure. Obviously, more than two conductor bars 55 and 56 could be utilized and the number of circuits leading to the series-connected thermoelectric materials could be increased to provide several parallel circuits each including a portion of the thermopile. The commutator 48 operates in the same manner as explained with respect to the arrangement of FIG. 1 to mechanically convert the alternating current into a pulsating direct current which is supplied to the opposite sides of the rotating thermopile structure.

As in the structure illustrated in FIG. 1, a labyrinth seal 57 is provided around the outer periphery of the rotatable thermoelectric heating and cooling unit to prevent the flow of air around the rotatable thermoelectric unit from one side to the other. It should be noted that the space between the thermocouple units is filled with a foam type insulating material of the type commonly used in the refrigeration industry to fill the space between the inner and outer walls of a refrigerator. The foam insulation material can be "foamed" into place after all of the thermocouples are mechanically in place and this arrangement greatly increases the strength of the overall structure. The foam material acts not only as a supporting structure for the thermoelectric materials but also forms a thermal insulation between the hot and cold junctions of the thermocouples and reduces the heat flow across the structure in the voids between the thermoelectric materials.

When the air conditioner of FIG. 2 is operated to cool the air within the enclosure 36, current is then directed through the thermoelectric junctions adjacent the side 6 so that they become cold. This side of the unit then absorbs heat from air being circulated through the opening 39 in the casing 32 over the fins 8*a* extending from the side 6. Heat absorbed from the enclosure air flowing through this portion of the unit is then transferred through the thermopile to the opposite side of the unit and sheet member 4 dissipates this heat through the fins 8 into the outdoor air being circulated over this portion of the unit. During rotation of the unit fins 8 and 8*a* act as blower vanes and propel air entering the case through the openings 38 and 39 outwardly toward the periphery of the case where it is discharged through the openings 41 and 42 to the enclosure and to the outside respectively. As in the previous arrangement of FIG. 1, the unit may be changed from cooling to heating merely by reversing the connection between the leads 53 and 54 conducting alternating current to the A.C. power source. These leads may be manually interchanged or the interchanging can be performed by means of a switching device controlled from an easily accessible control unit within the enclosure.

As will be noted in FIG. 2, no outlet opening is provided for air along the bottom of the enclosure side of the case 31. This is to prevent water, which condenses out of the warm room air passing in heat exchange relationship over the cold fins 8, from dropping onto the floor of the enclosure. Means (not shown) in the bottom of the case such as a drip tray and appropriate drain tubing, must be provided for collecting this condensate water and draining it to the opposite side of the case or otherwise removing it from the case.

While in accordance with the Patent Statutes there has been described what at present is considered to be the preferred embodiment of the invention, it will be understood by those skilled in the art that various changes and modifications may be made therein without departing from the invention, and it is therefore, the aim of the appended claims to cover all such changes and modifications as fall within the true spirit and scope of the invention.

What I claim as new and desire to secure by Letters Patent of the United States is:

1. A thermoelectric heating and cooling device utilizing the Peltier effect comprising a thermopile, means for rotatably mounting said thermopile within an aperture in a partition, means for energizing said thermopile with a source of direct current electrical power including a commutator rotatably mounted with said thermopile, and stationary conductor brushes associated with the commutator bars for conducting an alternating current from an A.C. power source to said commutator, and means including a synchronous motor adapted for connection to said A.C. power source for rotating said thermopile within said aperture of said partition at a rotational speed in synchronization with the frequency of said A.C. power source so that the alternating current conducted by said brushes to said commutator is converted to pulsating direct current by said commutator.

2. A thermoelectric heating and cooling device utilizing the Peltier effect comprising a thermopile, means for rotatably mounting said thermopile in an aperture in a partition, fin means extending from opposite sides of said thermopile in heat exchange relationship with air on opposite sides of said partition, a commutator means mounted for rotation with said thermopile, said commutator means including commutator bars and electrical contact brushes associated therewith, said electrical contact brushes adapted to conduct alternating current from a source of A.C. power to said commutator means, connectors leading from opposite bars of said commutating means to the opposite sides of said thermopile for energizing said thermopile with a source of direct current electrical power thereby to cool said fin means extending from one side of said thermopile while heating said fins extending from the other side thereof, and a synchronous motor for rotating said thermopile and said commutating means in synchronization with the frequency of the A.C. power source thereby to convert the alternating current conducted to said commutating means into a pulsating direct current for energizing said thermopile.

3. A thermoelectric heating and cooling device utilizing the Peltier effect comprising a rotatable shaft, first and second spaced apart sheet members of thermal conductive material rigidly mounted on said shaft, a thermopile mounted between said sheet members, said thermopile having thermal junctions arranged in heat transfer relationship with said sheet members and segregated so that said thermal junctions adjacent said first sheet member cool or heat said first sheet member while said thermal junctions adjacent said second sheet member heat or cool said second sheet member according to the direction of current flow through said thermopile, fin means extending from the outwardly disposed sides of said sheet members, a synchronous motor for driving said rotatable shaft, means adapted to electrically energize said synchronous motor with a source of A.C. power thereby to cause said motor to rotate said shaft in synchronized relationship with the frequency of said A.C. power source, a commutator having at least two opposed convertor segments mounted on said shaft, means including electrical contact brushes engaging said segments of said commutator for conducting an alternating current to said commutator whereby said alternating current is converted to a direct current, an electrical circuit including conductor bars connected between said commutator and said thermopile for conducting electric current to said thermopile and electrical filter means electrically connected into said circuit between said commutator and said thermopile for reducing the pulses of said direct current delivered to said circuit by said commutator.

4. A thermoelectric heating and cooling device utilizing the Peltier effect comprising a rotatable shaft, first and second spaced apart sheet members of thermal conductive material rigidly mounted on said shaft, a thermopile mounted between said sheet members, said thermopile having thermal junctions arranged in heat transfer relationship with said sheet members and segregated so that said thermal junctions adjacent said first sheet member cool or heat said first sheet member while said thermal junctions adjacent said second sheet member heat or cool said second sheet member according to the direction of current flow through said thermopile, fin means extending from the outwardly disposed sides of said sheet members, a synchronous motor for driving said rotatable shaft, means adapted to electrically energize said synchronous motor with a source of A.C. power thereby to cause said motor to rotate said shaft in synchronized relationship with the frequency of said A.C. power source, a commutator mounted on said shaft, said commutator having the same number of bars as said synchronous motor, means including electrical contact brushes engaging the commutator bars of said commutator for conducting an alternating current to said commutator whereby said alternating current is converted to a direct current, and conductor bars connected between said commutator and said thermopile for conducting said direct current to said thermopile.

References Cited in the file of this patent

UNITED STATES PATENTS

| | | |
|---|---|---|
| 2,192,709 | Lee | Mar. 5, 1940 |
| 2,959,018 | Hwang | Nov. 8, 1960 |